US010757506B2

(12) United States Patent
Chang et al.

(10) Patent No.: US 10,757,506 B2
(45) Date of Patent: Aug. 25, 2020

(54) AMPLIFIER CIRCUIT FOR A PARAMETRIC TRANSDUCER AND A RELATED AUDIO DEVICE

(71) Applicant: Nanyang Technological University, Singapore (SG)

(72) Inventors: Joseph Sylvester Chang, Singapore (SG); Tong Ge, Singapore (SG); Linfei Guo, Singapore (SG)

(73) Assignee: Nanyang Technological University, Singapore (SG)

( * ) Notice: Subject to any disclaimer, the term of this patent is extended or adjusted under 35 U.S.C. 154(b) by 55 days.

(21) Appl. No.: 15/506,849

(22) PCT Filed: Aug. 27, 2015

(86) PCT No.: PCT/SG2015/050282
§ 371 (c)(1),
(2) Date: Feb. 27, 2017

(87) PCT Pub. No.: WO2016/032400
PCT Pub. Date: Mar. 3, 2016

(65) Prior Publication Data
US 2017/0289684 A1 Oct. 5, 2017

Related U.S. Application Data

(60) Provisional application No. 62/042,825, filed on Aug. 28, 2014.

(51) Int. Cl.
*H04R 3/14* (2006.01)
*H04R 5/04* (2006.01)
(Continued)

(52) U.S. Cl.
CPC ............ *H04R 3/14* (2013.01); *H03F 3/183* (2013.01); *H03F 3/211* (2013.01); *H03F 3/2173* (2013.01);
(Continued)

(58) Field of Classification Search
CPC . H04R 3/14; H04R 3/04; H04R 1/403; H04R 2217/03; H03F 3/2178; H03F 3/211; H03F 3/183; H03F 2203/21112
See application file for complete search history.

(56) References Cited

U.S. PATENT DOCUMENTS

2002/0172375 A1    11/2002  Kolano et al.
2004/0047477 A1*    3/2004  Bank .................. H03F 3/181
                                                           381/120
(Continued)

FOREIGN PATENT DOCUMENTS

JP    2006135779 A    5/2006
JP    2008118247 A    5/2008
(Continued)

OTHER PUBLICATIONS

International Search Report for Application No. PCT/SG2015/050282 dated Oct. 20, 2015.
(Continued)

*Primary Examiner* — Ping Lee
(74) *Attorney, Agent, or Firm* — Lerner, David, Littenberg, Krumholz & Mentlik, LLP

(57) ABSTRACT

An amplifier circuit for a parametric transducer, comprising: a signal processor for processing an input signal into first and second signals; and at least a pair of output stages arranged to respectively receive the first and second signals for generating amplified first and second signals respectively, which are provided to operate the parametric transducer. The input, first and second signals are arranged with (Continued)

a substantially similar frequency to cause a switching frequency of the amplifier circuit to be matched to a carrier frequency of the parametric transducer. A related audio device is also disclosed.

9 Claims, 8 Drawing Sheets

(51) Int. Cl.
*H03F 3/217* (2006.01)
*H03F 3/183* (2006.01)
*H03F 3/21* (2006.01)
*H04R 1/40* (2006.01)
*H04R 3/04* (2006.01)

(52) U.S. Cl.
CPC .......... *H03F 3/2178* (2013.01); *H04R 1/403* (2013.01); *H04R 3/04* (2013.01); *H04R 5/04* (2013.01); *H03F 2203/21112* (2013.01); *H04R 2217/03* (2013.01)

(56) References Cited

U.S. PATENT DOCUMENTS

| | | | | |
|---|---|---|---|---|
| 2005/0281420 | A1* | 12/2005 | Sekino | B06B 1/0292 381/191 |
| 2007/0124620 | A1* | 5/2007 | Miyazaki | G03B 21/14 713/323 |
| 2013/0038391 | A1* | 2/2013 | Hlibowicki | H03F 1/32 330/251 |
| 2015/0248897 | A1* | 9/2015 | Nakayama | H04S 7/30 704/270 |

FOREIGN PATENT DOCUMENTS

| | | |
|---|---|---|
| JP | 2011234096 A | 11/2011 |
| JP | 2012114780 A | 6/2012 |
| WO | 2012122132 A1 | 9/2012 |

OTHER PUBLICATIONS

American Technology Corporation, "Theory, History, and the Advancement of Parametric Loudspeaker: a Technology Overview," Hypersonic Sound White Paper Rev. E [online]: http://www.atcsd.com/pdf/HSSWHTPAPERRevE.pdf.

D. Kewley-Port, T. Z. Burkle, and J. H. Lee, "Contribution of consonant versus vowel information to sentence intelligibility for young normal-hearing and elderly hearing-impaired listeners", Journal of Acoustical Society of America, 2007, pp. 2365-2375.

J. S. Chang, M. T. Tan, Z. Cheng, and Y. C. Tong, "Analysis and design of power efficient class D amplifier output stages", IEEE Trans. Circuits Syst. I, Fundam. Theory Appl., vol. 47, Jun. 2000, pp. 897-902.

W. S. Gan, J. Yang and T. Kamakura, "A review of parametric acoustic array in air", Applied Acoustics.

Y. Nakashima, T. Yoshimura, N. Naka and T. Ohya, "Prototype of Mobile Super Directional Loudspeaker", NTT DoCoMo Technology Journal vol. 8, No. 1, pp. 25-32.

\* cited by examiner (a)                                  (b)

(a) (b)

(c)

AMPLIFIER CIRCUIT FOR A PARAMETRIC TRANSDUCER AND A RELATED AUDIO DEVICE

CROSS REFERENCE TO RELATED APPLICATIONS

The present application is a national phase entry under 35 U.S.C. § 371 of International Application No. PCT/SG2015/050282, filed on Aug. 27, 2015, published in English, which claims priority from U.S. Provisional Patent Application No. 62/042,825 filed Aug. 28, 2014, the disclosures of which are incorporated by reference herein.

FIELD

The present invention generally relates to an amplifier circuit for a parametric transducer, and a related audio device.

BACKGROUND

With the use of personal smart devices as personal communication and entertainment devices becoming ubiquitous, audio privacy is increasingly also becoming a serious concern. In most instances where audio sound is openly played through loudspeakers of smart devices (e.g. via a "speakerphone", where a smartphone is typically placed at a distance of about 20 cm away from a user's mouth), a drawback is that there is little audio privacy, and also often creates "noise pollution" to bystanders. Put simply, the audio sound played through the smart devices may be heard desirably by an intended listener, and also undesirably by the bystanders, since they may have no interest to listen in.

One way to address the above issue is to use parametric loudspeakers. Compared to conventional loudspeakers (which are typically installed in modern smart devices), parametric loudspeakers feature significantly improved audio privacy, since audio sound generated by the parametric loudspeakers is highly directional and so, a private audio zone may accordingly be created. However, at this juncture, parametric loudspeakers are typically employed only in outdoor applications, but not for portable smart devices. Reasons why that is so include due to high power dissipation, subdued low frequency response, and poor directivity of parametric loudspeakers (if a size of the associated transducer is reduced, e.g. to less than 10 cm$^2$). On the high power dissipation issue, it has been determined that more than 5 W of power is needed to operate parametric loudspeakers to generate about 63 dB Sound Pressure Level (SPL) at a distance of 50 cm at 1 kHz, whereas to generate audio sound of comparable loudness using traditional audio loudspeakers, only a power of less than 1 W is required. On the directivity issue, in order to ensure a reasonable directivity, a size of the transducer for the parametric loudspeakers needs to typically be greater than 25 cm$^2$.

The operation principle of parametric loudspeakers is described below. A parametric loudspeaker is configured to emit a beam of amplitude-modulated ultrasonic signal, which is then demodulated in the air, thereby generating a desired audible audio signal. As the frequency of the ultrasonic signal is high (i.e. typically greater than 40 kHz), the ultrasonic signal is thus highly directional and consequently the demodulated audio signal is also highly directional, resulting in creation of the private audio zone.

More specifically, FIG. 1 shows schematics of a parametric loudspeaker system 100, which includes a signal processor 102, a carrier generator 104, a (Class D) power amplifier 106, and a parametric emitter 108 (or otherwise known as a parametric loudspeaker). The signal processor 102 first processes an audio input signal 110 and generates a desired envelop signal of the audio input signal 110. The envelop signal modulates an ultrasonic frequency carrier signal provided by the carrier generator 104, and an amplitude modulated ultrasonic signal is then generated. Depending on the type of ultrasonic emitter used in, and a design of the parametric emitter 108, a carrier frequency of the generated ultrasonic signal may range from 30 kHz to 200 kHz. The power amplifier 106 serves to amplify the ultrasonic signal and provide sufficient current to drive the parametric emitter 108. By means of transduction, the parametric emitter 108 generates the acoustically modulated ultrasonic signal. The ultrasonic signal is demodulated in the air, and the desired audible audio signal is obtained. The parametric emitter 108 may be realized using a bimorph transducer (not shown) or an array 200 of ultrasonic transducers 202 (i.e. refer to FIGS. 2a and 2b). For the latter configuration, the ultrasonic transducers 202 are positioned in a honeycomb-like arrangement and connected in parallel. The purpose of having multiple ultrasonic transducers 202 is to increase a sound pressure level of the generated ultrasonic signal (i.e. which is outwardly emitted in a direction from a transmission plane of each ultrasonic transducer 202), hence increasing an acoustical loudness of the demodulated audio signal.

However, it is to be appreciated that conventional parametric loudspeakers nonetheless suffer from some drawbacks which include:

High Power Dissipation

Reasons for the high power dissipation include: (i) requiring generation of high ultrasonic Sound Pressure Level (SPL) for obtaining an audio signal with sufficient loudness, and (ii) suffering from low power-efficiency by the power amplifier 106. The former reason is due to the highly inefficient demodulation process in the air. For instance, to generate a 66 dB audio signal, a 130 dB ultrasonic signal is needed, meaning that the attenuation losses in reality are fairly high (i.e. 130 dB—66 dB=44 dB). When translated to power terms, this means that approximately 5 W of ultrasound power is needed to obtain an equivalent of 1 W of audio power. On the other hand, reason (ii) is mainly due to the high-switching frequency of the conventional power amplifier 106. It is highlighted that amongst the various components of the parametric loudspeaker system 100 depicted in FIG. 1, the power amplifier 106 is the most power dissipative component, and dissipates about 90% of the total power used by the system 100. So, to reduce the overall power dissipation of the system 100, it is important that the amplifiers used therein have high power-efficiencies. In this respect, Class D amplifiers are usually employed for their significantly higher power-efficiency compared to their linear counterparts. But, unlike Class D amplifiers used in traditional audio loudspeakers whose power-efficiency is usually very high (i.e. greater than 95%), the power-efficiency of conventional Class D amplifiers deployed for parametric loudspeakers tends to be relatively low, typically less than 80%. The low power-efficiency is due to a high supply voltage used (i.e. greater than 20 V) and high switching frequencies (i.e. greater than 400 kHz) of the Class D amplifiers, which may also generate undesirable electromagnetic interferences (EMI).

More specifically, conventional Class D amplifiers tend to be configured with a high switching frequency—typically about 10 times higher than the bandwidth of the amplifiers. The high switching frequency consequently results in high power dissipation in the Class D amplifiers. This is especially so for parametric-loudspeaker applications because of the wide bandwidth (i.e. which is greater than a carrier frequency of the parametric loudspeaker, for example greater than 40 kHz) and the high supply voltage used for the Class D amplifiers. A conventional Class D amplifier 300, coupled to a parametric emitter 301, is depicted in FIG. 3 for reference sake. The conventional Class D amplifier 300 comprises an integrator 302, a triangular wave generator 304, a pair of comparators 306a, 306b, and two Class D output stages 308a, 308b. The integrator 302 amplifies an input ($V_{in}$) and feedback signals, and provides a high loop gain in the feedback branches. The triangular wave generator 304 generates a triangular waveform, and the pair of comparators 306a, 306b then compares the triangular waveform with respective outputs ($V_{int1}$, $V_{int2}$) from the integrator 302 to generate corresponding Pulse-Width-Modulated (PWM) switching signals. A switching frequency of the switching signals (or a frequency of the triangular waveform) is typically 10 times higher than the input signal ($V_{in}$). In the case of parametric-loudspeaker applications, the switching frequency is typically about 400 kHz. As aforementioned, power amplifiers typically dissipate the most power, and the power loss incurred is largely proportional to a switching frequency of the power amplifiers. So, to improve the power-efficiency of the Class D amplifier 300, it is important that the switching frequency of the Class D amplifier 300 is sufficiently low. For completeness, it is to be appreciated that an inductor 310 ($L_s$) and a resistor 312 ($R_s$), coupled to respective outputs of the two Class D output stages 308a, 308b, are configured to filter any switching components of the Class D amplifier 300, but may optionally be omitted depending on a design of the Class D amplifier 300 and technical characteristics of the parametric emitter 301.

Limited Directivity

Limited directivity happens when a size of a parametric emitter is arranged to be dimensionally small. Particularly, the directivity of an audio beam generated by a parametric emitter largely depends on a transducing area, and a specific carrier frequency of said parametric emitter. A higher carrier frequency results in better directivity, but however incurs higher power dissipation by the parametric emitter. It has been shown that having a carrier frequency of about 40 kHz presents a rather good trade-off between the power dissipation and directivity issues. Also to ensure a good directivity, a size of the transducing area of a parametric emitter preferably should be greater than 25 cm.

One object of the present invention is therefore to address at least one of the problems of the prior art and/or to provide a choice that is useful in the art.

SUMMARY

According to a $1^{st}$ aspect of the invention, there is provided an amplifier circuit for a parametric transducer, comprising: (i) a signal processor for processing an input signal into first and second signals; and (ii) a pair of output stages arranged to respectively receive the first and second signals for generating amplified first and second signals respectively, which are provided to operate the parametric transducer. The input, first and second signals are arranged with a substantially similar frequency to cause a switching frequency of the amplifier circuit to be matched to a carrier frequency of the parametric transducer.

Advantageously, matching the switching frequency to the carrier frequency enables significant reduction in "wasted power" of the amplifier circuit, and hence substantially improves the power-efficiency of the amplifier circuit. Also, the EMI emission of the amplifier circuit 400 is reduced as a result.

Preferably, the signal processor may include a signal separator.

Preferably, the amplifier circuit may further comprise a resistive circuit element, and an inductive circuit element serially coupled to respective outputs of the pair of output stages.

Preferably, the signal processor may further be configured to receive the input signal.

Preferably, the first and second signals may further be generated with different phase-shifts.

Preferably, the carrier frequency may be 40 kHz.

Preferably, the pair of output stages may include being coupled to the parametric transducer.

Preferably, the amplifier circuit may further include at least a pair of comparators arranged to respectively receive the first and second signals for generating corresponding first and second switching signals, wherein the first and second switching signals are provided to the output stages, and the amplified first and second signals are respectively amplified first and second switching signals.

Preferably, the amplifier circuit may be a Class D amplifier, and the output stages are correspondingly Class D output stages.

According to a $2^{nd}$ aspect of the invention, there is provided an audio device comprising: (i) a signal processor for processing an input signal into first and second signals with different phase-shifts; (ii) at least a pair of parametric transducers; and (iii) at least two pairs of output stages arranged to respectively receive the first and second signals for generating two pairs of amplified signals, which are respectively provided to the parametric transducers for generating corresponding ultrasonic signals with the phase-shifts. The signal processor, and output stages collectively form an amplifier circuit, and the input, first and second signals are arranged with a substantially similar frequency to cause a switching frequency of the amplifier circuit to be matched to carrier frequencies of the parametric transducers. Also, the parametric transducers are arranged to direct the ultrasonic signals towards a common area in the air to cause interaction of the ultrasonic signals within the area to obtain an audible audio signal.

Beneficially, the proposed audio device (of the $2^{nd}$ aspect) enjoys significant reduced power consumption due to the improved characteristic of the amplifier circuit (as set out in the $1^{st}$ aspect), whilst also allowing a user to retain his audio privacy when listening to audio output from his personal smart device.

Preferably, the signal processor may include a signal separator.

Preferably, the device may further comprise a resistive circuit element, and an inductive circuit element coupled to outputs of the respective pairs of output stages.

Preferably, the signal processor may be further configured to receive the input signal.

Preferably, the carrier frequency may be 40 kHz.

Preferably, each parametric transducer may include a bimorph transducer or at least one ultrasonic transducer.

Specifically, the at least one ultrasonic transducer may include a plurality of ultrasonic transducers.

Preferably, the device may further include at least a pair of comparators arranged to respectively receive the first and second signals for generating corresponding first and second switching signals, wherein the first and second switching signals are respectively provided to the two pairs of output stages, and the two pairs of amplified signals are amplified switching signals.

Preferably, the amplifier circuit may be a Class D amplifier, and the output stages are Class D output stages.

According to a $3^{rd}$ aspect of the invention, there is provided an audio device comprising: (i) a parametric transducer arranged to generate a first audio signal based on a first signal; and (ii) a low frequency transducer arranged to generate a second audio signal based on a second signal. The first audio signal has a frequency higher than a predetermined frequency, and the second audio signal has a frequency lower than the predetermined frequency.

The audio device (of the $3^{rd}$ aspect) helps to beneficially improve audio privacy for users of personal smart devices that incorporate said audio device. The audio device is realised as a loudspeaker.

Preferably, the device may further comprise at least a signal processor for processing an input signal into the first and second signals.

Preferably, the signal processor may further include a low pass filter and a high pass filter configured to enable generation of the second signal and first signal respectively.

Preferably, the signal processor may further include respective power amplifiers to amplify the first and second signals prior to providing the first and second signals to the audio and parametric transducers.

Preferably, the signal processor may yet further include a second signal processor in cooperative arrangement with a carrier generator for further processing the first signal, prior to providing the first signal to the parametric transducer.

Preferably, the audio device may be a loudspeaker.

Preferably, the predetermined frequency may be 800 Hz.

Preferably, the parametric transducer may include a bimorph transducer or at least one ultrasonic transducer.

More specifically, the at least one ultrasonic transducer may include a plurality of ultrasonic transducers.

Preferably, the parametric and low frequency transducers may be integrally formed to have a common axis.

According to a $4^{th}$ aspect of the invention, there is provided a speaker apparatus comprising a plurality of the audio device of the $3^{rd}$ aspect, wherein the apparatus has a uniform thickness, and the thickness is substantially similar to a printed film.

The speaker apparatus may be manufactured cheaply using conventional suitable printing techniques to produce the necessary transducers, and also the apparatus can inconspicuously be incorporated in wallpapers for rooms, due to its relatively thin thickness, for a broad range of envisaged applications (e.g. to advantageously realise functionalities for a smart home).

Preferably, the thickness of the speaker apparatus may be less than 1 mm, and more specifically, the thickness is about 20 μm to 200 μm.

It should be apparent that features relating to one aspect of the invention may also be applicable to the other aspects of the invention.

These and other aspects of the invention will be apparent from and elucidated with reference to the embodiments described hereinafter.

BRIEF DESCRIPTION OF THE DRAWINGS

Embodiments of the invention are disclosed hereinafter with reference to the accompanying drawings, in which.

DETAILED DESCRIPTION OF PREFERRED EMBODIMENTS

Figure 3:
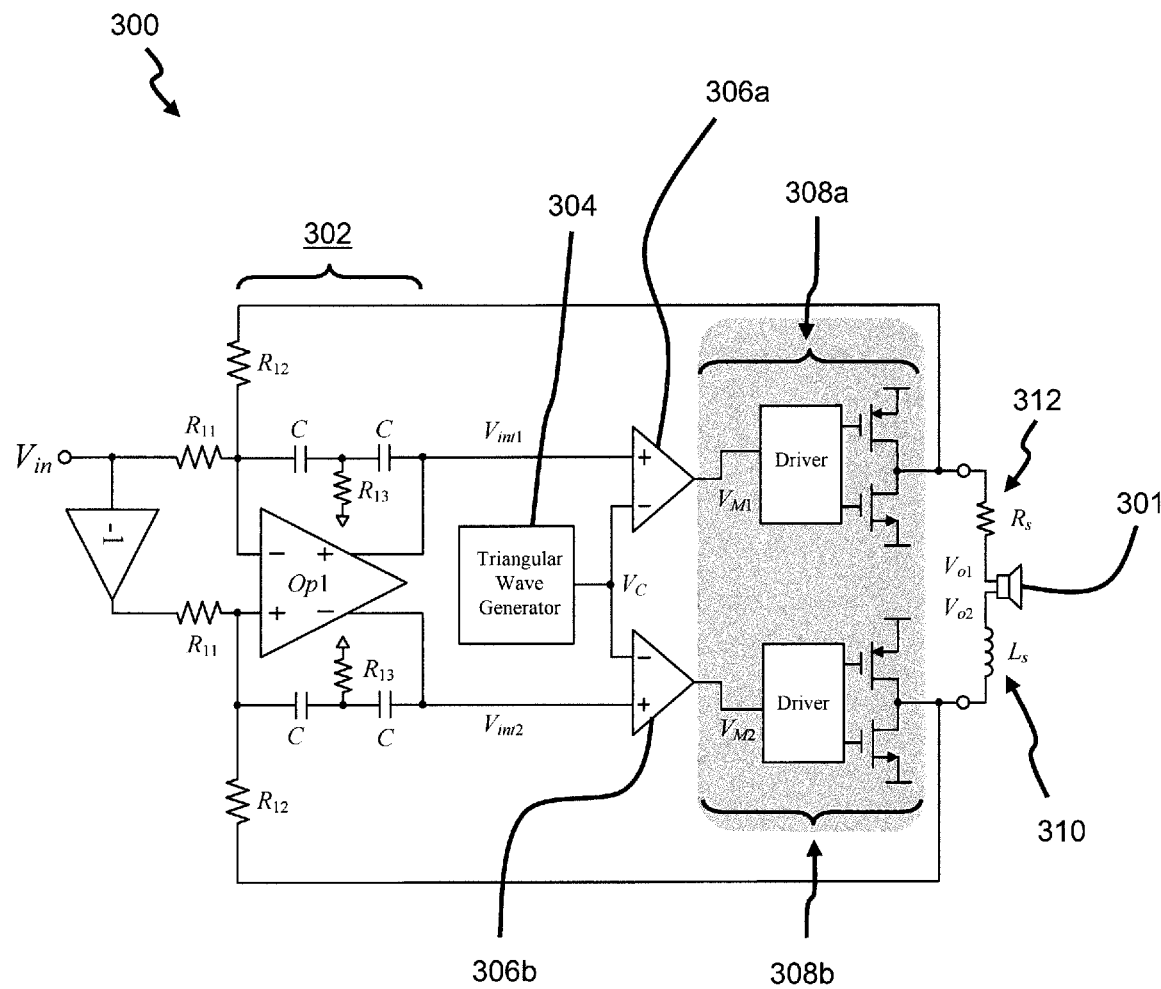
FIG. 3 is a schematic diagram of a conventional Class D amplifier (CDA), according to the prior art.
Figure 4:
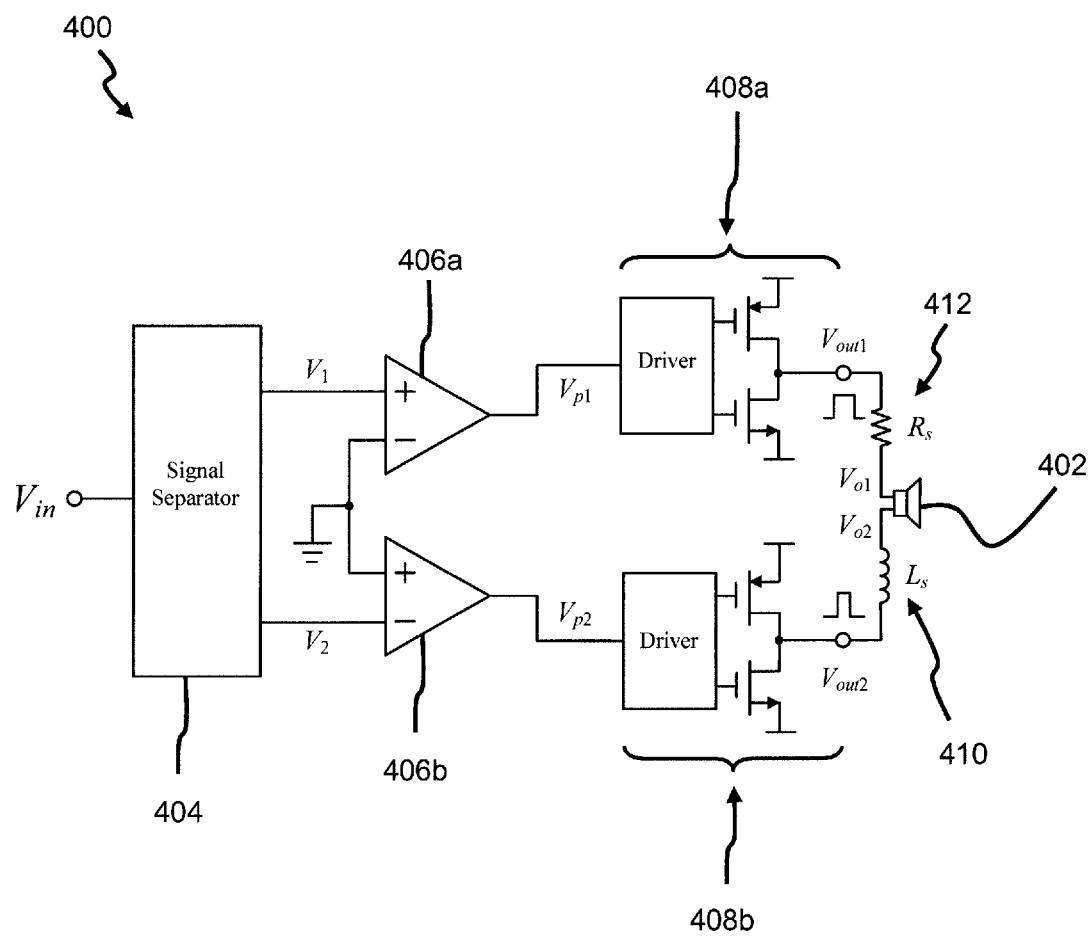
FIG. 4 is a schematic diagram of a Class D amplifier circuit for a parametric transducer, based on a first embodiment.

FIG. 4 shows schematics of a Class D amplifier circuit 400 for a parametric transducer 402, based on a first embodiment. It is to be appreciated that the term parametric transducer 402 is used throughout the description here to refer to a parametric emitter/loudspeaker, and hence not to be construed as limiting. Specifically, the amplifier circuit 400 comprises: a signal processor 404 (realised in the form of a signal separator in this case) for processing an input signal ($V_{in}$) into first and second signals ($V_1$, $V_2$); at least a pair of (first and second) comparators 406a, 406b arranged to respectively receive the first and second signals ($V_1$, $V_2$) for generating corresponding (digital-like) first and second switching signals ($V_{p1}$, $V_{p2}$); and at least a pair of similar (first and second) Class D output stages 408a, 408b arranged to respectively receive the first and second switching signals ($V_{p1}$, $V_{p2}$) for generating amplified first and second switching signals ($V_{out1}$, $V_{out2}$) respectively, which are provided to operate the parametric transducer 402 for obtaining an audible audio signal. It is to be appreciated that any type of suitable Class D output stage may be used for the first and second Class D output stages 408a, 408b. The input signal ($V_{in}$), which is an ultrasonic signal, is an electrical equivalent corresponding to the audible audio signal. An inductor 410 ($L_s$) and a resistor 412 ($R_s$), coupled to respective outputs of the two Class D output stages 408a, 408b, function similarly as per the case of conventional Class D amplifiers (as described afore in FIG. 3), and thus are also optional in this embodiment as well.

The electrical connections between the various components of the amplifier circuit 400 are now described. The signal processor 404 is configured to receive the input signal ($V_{in}$), and generate the first and second signals ($V_1$, $V_2$) respectively at first and second output terminals. The first output terminal is electrically coupled to a positive input terminal of the first comparator 406a, while the second output terminal is electrically coupled to a negative input terminal of the second comparator 406b. On the other hand, a negative input terminal of the first comparator 406a and a positive input terminal of the second comparator 406b are coupled to an AC ground of the amplifier circuit 400. Respective output terminals of the first and second comparators 406a, 406b are electrically coupled to respective input terminals of the first and second Class D output stages 408a, 408b. An output terminal of the first Class D output stage 408a is serially coupled to the resistor 412 ($R_s$), which in turn couples to a first input terminal of the parametric transducer 402. On other hand, an output terminal of the second Class D output stage 408b is serially coupled to the inductor 410 ($L_s$), which then couples to a second input terminal of the parametric transducer 402.

It is to be appreciated that the magnitude and frequency of the first and second signals ($V_1$, $V_2$) are approximately the same as the input signal ($V_{in}$), except that there is a slight phase-shift imparted. It is to be appreciated that the first and second signals ($V_1$, $V_2$) have different phase-shifts with respect to the input signal ($V_{in}$), and are respectively expressed in accordance with equations (3)-(5) to be described below. Specifically, the input ($V_{in}$), first and second signals ($V_1$, $V_2$) are arranged with a substantially similar frequency to cause a switching frequency of the amplifier circuit 400 to be matched to a carrier frequency of the parametric transducer 402. Preferably, the carrier frequency is arranged to be 40 kHz, but is not to be construed as limiting, since the amplifier circuit 400 is dynamically configurable to match the carrier frequency of any parametric transducer intended to be used with the amplifier circuit 400. To be elaborated later, this beneficially has an advantage of lowering EMI emitted by, and also significantly improving the power-efficiency of the amplifier circuit 400, achieved through reducing power dissipation of the amplifier circuit 400. This is to be contrasted with conventional Class D amplifiers, which are instead configured with switching frequencies significantly higher than carrier frequencies of parametric transducers used therewith.

The operation principle of the amplifier circuit 400 is set out theoretically with supporting equations below. In parametric-loudspeaker applications, the input of the amplifier circuit 400 may be expressed as:

$$V_{in} = A_0 \cos(\omega_C t + \varphi(t)) \tag{1}$$

wherein $A_0$ is the envelop signal and represents the input audio signal, $\cos(\omega_C t + \varphi(t))$ is the carrier signal of the parametric transducer 402, $\omega_C$ is the carrier frequency in rad/s, and $\varphi(t)$ is the phase-shift of the carrier signal.

Using straightforward trigonometry, the input signal ($V_{in}$) may be expressed as a sum of the first and second signals ($V_1$, $V_2$) having equal magnitude $V_1$, and $V_2$, specifically set out as:

$$V_{in} = V_1 + V_2 \tag{2}$$

and further wherein:

$$V_1 = V_0 \cos(\omega_C t + \varphi(t) + \theta(t)) \tag{3}$$

$$V_2 = V_0 \cos(\omega_C t + \varphi(t) - \theta(t)) \tag{4}$$

$$\theta(t) = \cos^{-1}\left(\frac{A_0}{2V_0}\right) \tag{5}$$

wherein $V_0$ is the amplitude of the two separated signals, and $\theta(t)$ is the phase shift.

Figure 5:
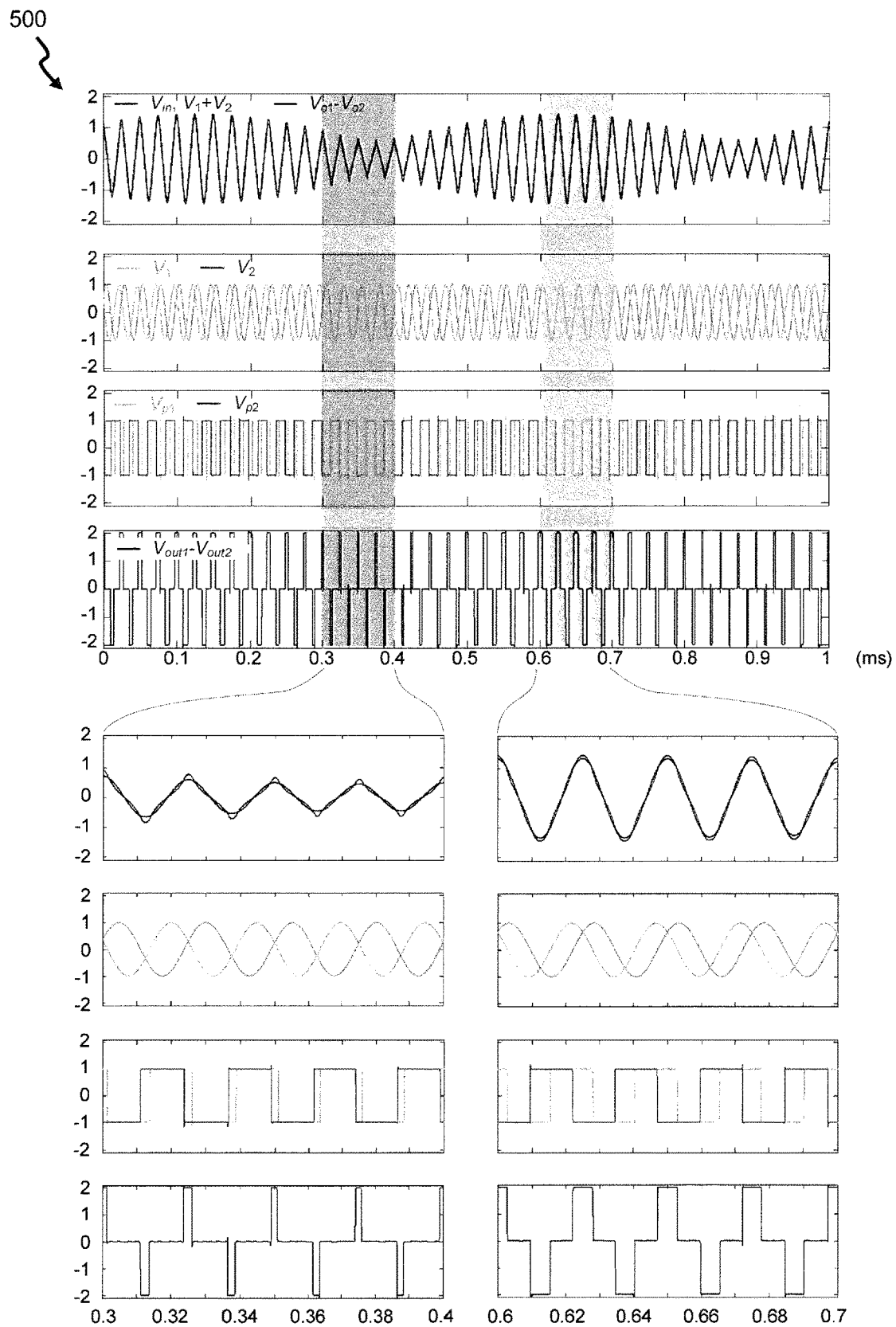
FIG. 5 depicts various waveforms generated at different stages of the amplifier circuit of FIG. 4.

As mentioned, the first and second signals ($V_1$, $V_2$) are converted to the first and second switching signals ($V_{p1}$, $V_{p2}$) by comparison against the AC ground of the amplifier circuit 400. For reference, the associated waveforms 500 generated at different stages of the proposed amplifier circuit 400 are shown in FIG. 5. It is to be noted that the frequency of the first and second signals ($V_1$, $V_2$), as generated, is approximately the same as the input signal ($V_{in}$) and hence the switching frequency of the amplifier circuit 400 is approximately the same as the carrier frequency of the parametric transducer 402. The higher order harmonics of the input signal ($V_{in}$) are filtered by the inductor 410 and resistor 412, and the desired signal is recovered at the output of the pair of Class D output stages 408a, 408b, prior to being provided to the parametric transducer 402. Of interest, it may be seen from FIG. 5 that the voltage ($V_{o1}$-$V_{o2}$) across the parametric transducer 402 is fairly similar to the input signal ($V_{in}$) (i.e. being the desired output signal also to be obtained at the parametric transducer 402). It is to be appreciated that the slight difference between $V_{o1}$-$V_{o2}$ and the input signal ($V_{in}$) is due to the limited attenuation of the higher order harmonics of the input signal ($V_{in}$), but is inconsequential due to its high frequency (e.g. about 3 times that of the carrier frequency).

Consequently, the significantly reduced switching frequency of the amplifier circuit 400 (i.e. reduced by about 10 times compared to the Class D amplifier 300 of FIG. 3) results in significantly reduced "wasted power" of the amplifier circuit 400, and hence substantially improves the power-efficiency of the amplifier circuit 400 from 80% to about 95%. So, due to the low power usage, the amplifier circuit 400 may be envisaged for suitable use in any mobile applications, where power resource is constrained. It is to be appreciated that the hardware of the proposed amplifier circuit 400 is uncompromised, i.e. the hardware is comparable to the Class D amplifier 300 of FIG. 3. To clarify the preceding statement, it is appreciated an IC area required for implementing the proposed Class D amplifier 400 is comparable to the conventional amplifier 300. This is because the Class D output stages 408a, 408b tend to occupy a large (i.e. more than 80%) portion of the total IC area. So since the output stages 408a, 408b of the proposed Class D amplifier 400 is largely same as the conventional amplifier 300, the corresponding IC areas of both amplifiers are thus of about the same size.

Besides the improved power-efficiency, EMI emission of the amplifier circuit 400 is also significantly lower due to its lower switching frequency. As a comparison, it is to be highlighted that due to the high supply voltage requirement for parametric-loudspeaker applications, the EMI emission of the conventional Class D amplifier 300 of FIG. 3 can be rather high, and so may undesirably affect the operating performance and functionality of other electronic circuits positioned in the vicinity.

The remaining configurations will be described hereinafter. For the sake of brevity, description of like elements, functionalities and operations that are common between the different configurations are not repeated; reference will instead be made to similar parts of the relevant configuration(s).

Figure 6:
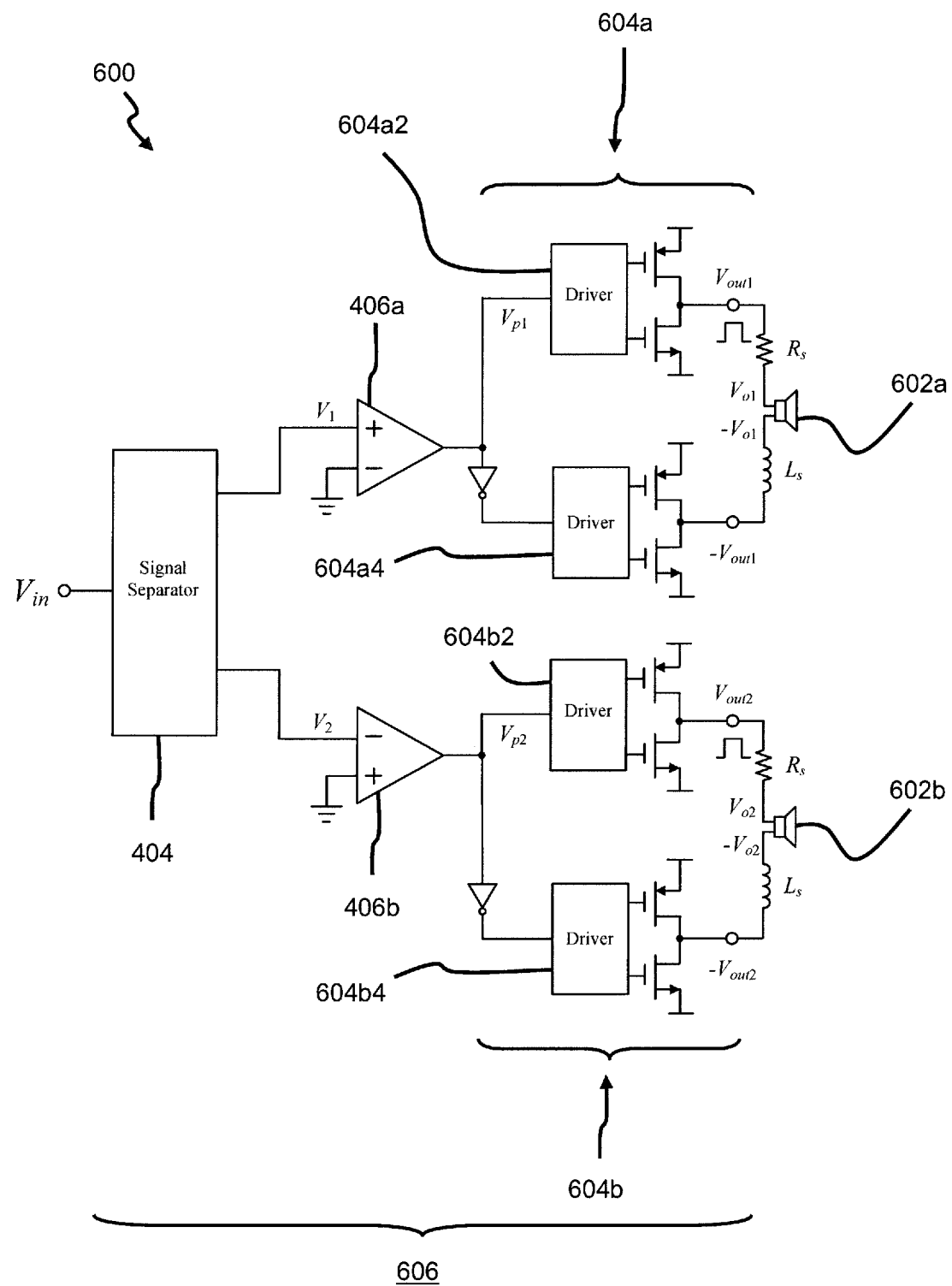
FIG. 6 is a schematic diagram of an audio device, based on a second embodiment.

According to a second embodiment, there is disclosed an audio device 600 (as shown in FIG. 6), which is largely based on the first embodiment. An object of the audio device 600 is to enable improvement in the general directivity of parametric loudspeakers, coupled with lower power dissipation, without increasing a physical size of the parametric loudspeakers or a carrier frequency thereof.

Figure 7:
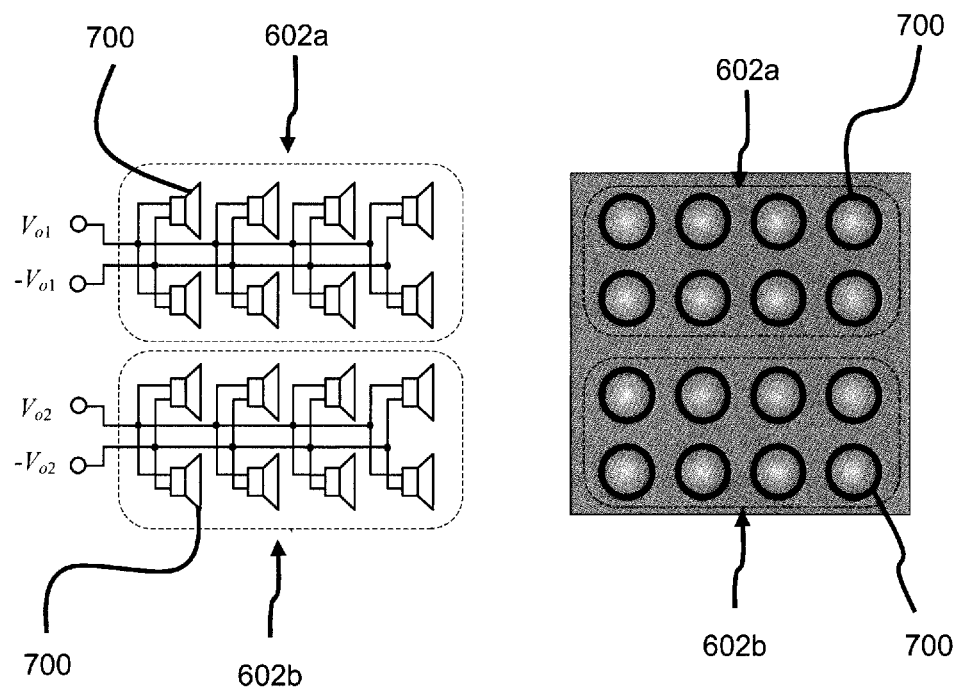
FIG. 7 includes FIGS. 7a to 7c, which respectively is a schematic diagram of a pair of plurality of ultrasonic transducers which form a pair of parametric emitters of the audio device of FIG. 6, a front view of the arrangement of FIG. 7a, and an illustration of an arrangement of the pair of parametric emitters to cooperatively create an audio zone in the air.
Figure 7:
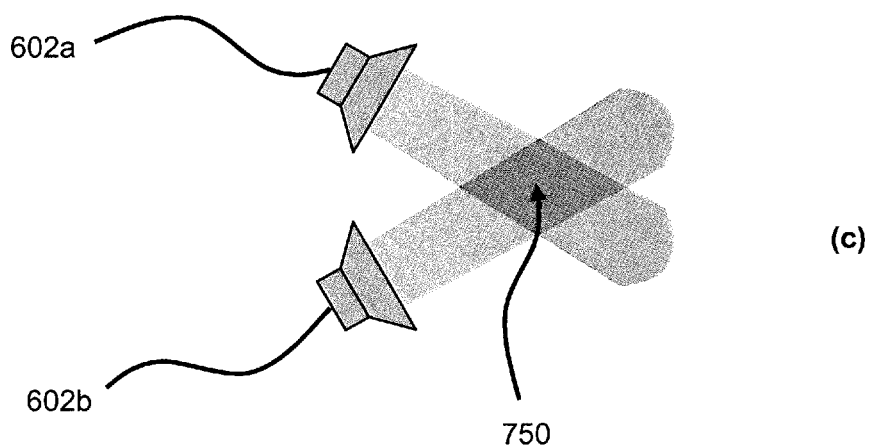

The audio device 600 may be incorporated into smart devices, and comprises: the signal processor 404 (of FIG. 4)

for processing an input signal ($V_{in}$) into first and second signals ($V_1$, $V_2$) having different phase-shifts, in which the input signal ($V_{in}$) is an electrical equivalent of an audible audio signal; the first and second comparators 406a, 406b (of FIG. 4) arranged to respectively receive the first and second signals ($V_1$, $V_2$) for generating corresponding (digital-like) first and second switching signals ($V_{p1}$, $V_{p2}$); at least a pair of (first and second) parametric transducers 602a, 602b; and at least two similar (first and second) pairs of Class D output stages 604a, 604b arranged to respectively receive the first and second switching signals ($V_{p1}$, $V_{p2}$) for generating two pairs of amplified switching signals ($V_{out1}$, $-V_{out1}$ and $V_{out2}$, $-V_{out2}$), which are respectively provided to the parametric transducers 602a, 602b for generating corresponding ultrasonic signals having the different phase-shifts. The first pair of Class D output stages 604a includes first and second output stages 604a2, 604a4, while the second pair of Class D output stages 604b includes third and fourth output stages 604b2, 604b4. Each output stage 604a2, 604a4, 604b2, 604b4 is similar to any of the Class D output stages 408a, 408b of the first embodiment. Also, each parametric transducer 602a, 602b comprises an arrangement of equal plurality of ultrasonic transducers 700 (i.e. see FIGS. 7a and 7b), and each corresponding pair of amplified switching signals ($V_{out1}$, $-V_{out1}$, and $V_{out2}$, $-V_{out2}$) is provided to each parametric transducer 602a, 602b. In other cases, each parametric transducer 602a, 602b may also be formed from other suitable transducers, as necessary, such as a bimorph transducer.

Further, the two ultrasonic signals generated have a same magnitude and frequency. More specifically, the frequency of the two ultrasonic signals is the same as the input signal, and the magnitude of the two ultrasonic signal is the same to each other, but however may be different to the input signal ($V_{in}$). It is to be appreciated that each ultrasonic signal on its own is not decipherable sensibly, and simply perceived as noise, if heard. The parametric transducers 602a, 602b are cooperatively arranged to direct the generated ultrasonic signals towards a common area/zone in the air to cause acoustic interaction between the ultrasonic signals within the area to obtain the audible audio signal. Specifically, the interaction involves demodulating and acoustically combining the two ultrasonic signals (with different phase-shifts) in the air to obtain a resultant ultrasonic signal, which is an amplitude-modulated ultrasonic signal. The amplitude-modulated ultrasonic signal demodulates in the air to provide the desired audible audio signal. The common area in the air where the audible audio signal is obtained may be termed as a private audio zone 750 (i.e. see FIG. 7c). The audible audio signal can only be heard by a listener positioned within the private audio zone 750 and not anywhere else, thus meaning that any other listeners outside of the private audio zone 750 are unable to hear the audio signal simply by listening to the two ultrasonic signals separately.

Moreover, it is to be appreciated that the signal processor 404, the comparators 406a, 406b, and the output stages 604a, 604b together form an amplifier circuit 606. From observing FIG. 4 and FIG. 6, it will be seen that the amplifier circuit 606 of FIG. 6 is in fact analogous to the configuration of the amplifier circuit 400 of FIG. 4, and thus the audio device 600 also enjoys all the advantages as set forth in the first embodiment. That is, the first pair of Class D output stages 604a collectively corresponds to the first Class D output stage 408a of FIG. 4, whereas the second pair of Class D output stages 604b collectively corresponds to the second Class D output stage 408b of FIG. 4. Similarly, the input ($V_{in}$), first and second signals ($V_1$, $V_2$), with reference to the amplifier circuit 606, are arranged with a substantially similar frequency to cause a switching frequency of the amplifier circuit 606 to be matched to carrier frequencies of the parametric transducers 602a, 602b. It is to be appreciated that the carrier frequencies of the parametric transducers 602a, 602b are similar. Accordingly, the above described electrical connections between the different components of the amplifier circuit 400 of FIG. 4 therefore also apply, mutatis mutandis, to the components of the audio device 600, and hence will not be repeated for brevity. Further, the equations (1)-(5) may also be applied accordingly in the same manner to describe the amplifier circuit 606 of FIG. 6.

Figure 1:
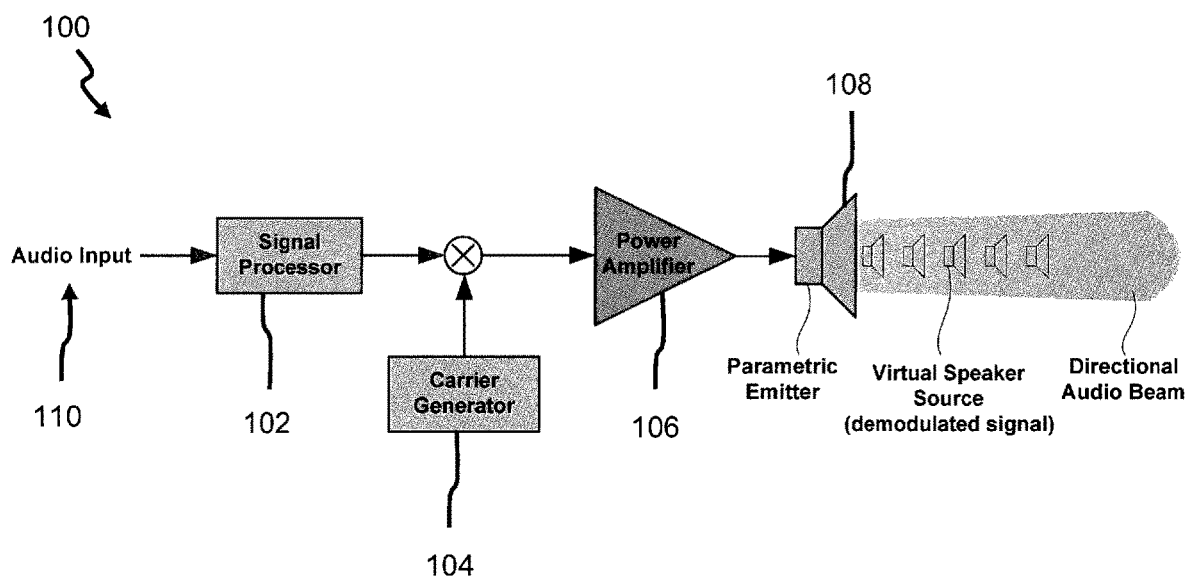
FIG. 1 is a schematic diagram of a parametric loudspeaker system, according to the prior art.
Figure 2:
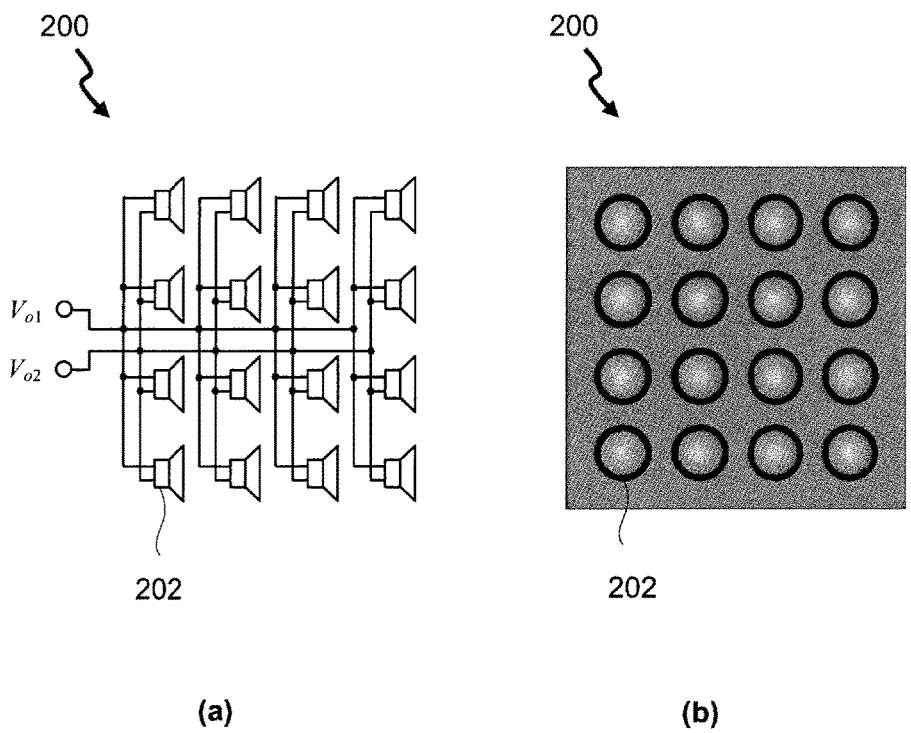
FIG. 2 includes FIGS. 2a and 2b, which respectively is a schematic diagram of a plurality of ultrasonic transducers arranged to form a parametric emitter, and a front view of said arrangement of FIG. 2a, according to the prior art.

It will be understood by now that unlike conventional parametric loudspeakers (e.g. see FIG. 3) where only one parametric transducer is employed, the proposed audio device 600 includes at least two parametric transducers 602a, 602b, in which each parametric transducer 602a, 602b is electrically driven by an individual Class D amplifier. Comparing to the first embodiment, where the first and second signals ($V_1$, $V_2$) are electrically combined in the proposed amplifier circuit 400, the current set of first and second signals ($V_1$, $V_2$) in the second embodiment are instead acoustically combined in the air, as explained above. It is also to be highlighted that although at least two parametric transducers 602a, 602b are employed for this embodiment, a total number of ultrasonic transducers 700 used is however the same as the parametric loudspeaker system 100 depicted in FIGS. 1 and 2. In other words, an overall combined size of the two parametric transducers 602a, 602b is the same as the size of the single parametric loudspeaker 108 of FIG. 1.

It is also to be appreciated that if any additional parametric transducers are to be added to the configuration set out in FIG. 6, then an accompanying comparator together with an associated pair of Class D output stages need accordingly be required for each additional parametric transducer included in the new configuration. Needless to say, the signal processor 404 is configured to adaptively process the input signal ($V_{in}$) into a corresponding number of secondary signals, depending on a number of comparators arranged in the new configuration. But the remaining operation of the audio device 600 will remain the same as above described.

Figure 8:
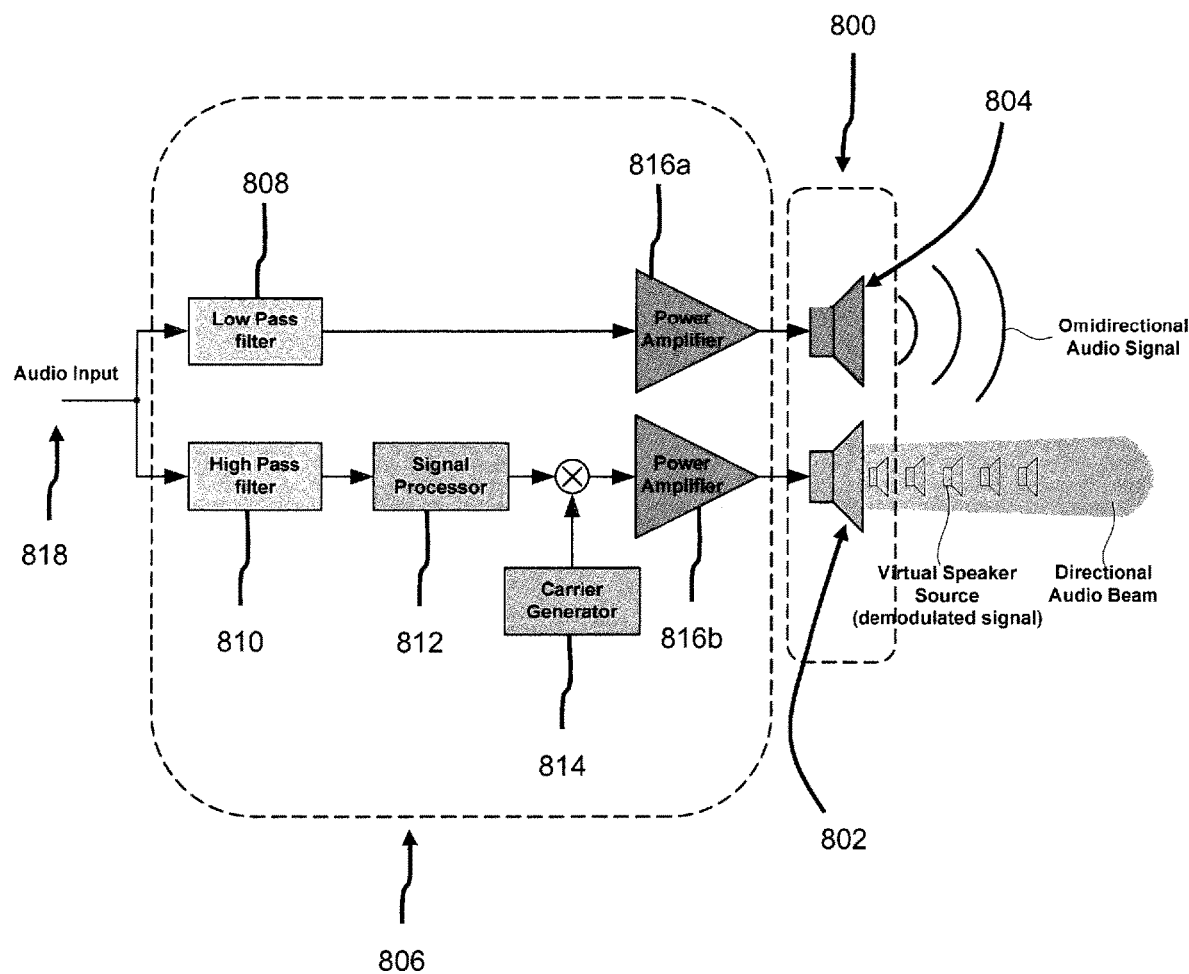
FIG. 8 is a schematic diagram of a further audio device, based on a third embodiment.

Based on a third embodiment, in FIG. 8, there is disclosed another audio device 800 comprising: a parametric transducer 802 arranged to generate a first audio signal based on a first signal; and a low frequency transducer 804 arranged to generate a second audio signal based on a second signal, wherein the first audio signal has a frequency higher than a predetermined frequency (e.g. 800 Hz), and the second audio signal has a frequency lower than the predetermined frequency, and wherein the parametric and low frequency transducers 802, 804 are integrally formed to have a common central axis. The first signal has the same frequency as the first audio signal, and the second signal correspondingly has the same frequency as the second audio signal. The parametric and low frequency transducers 802, 804 are shown separately in FIG. 8 simply for ease of illustration and explanation, and hence not to be construed as such. So, after generation, the propagating first and second audio signals moving outwardly away from the audio device 800 share a common central axis. It is to be appreciated that the first audio signal is generated as a directional audio beam, while the second audio signal is generated as an omnidirectional audio signal. More specifically, the audio device 800 is a loudspeaker in this case. The parametric transducer 802 may include a bimorph transducer, or at least one ultrasonic transducer (which can also be a plurality of ultrasonic transducers). The low frequency transducer 804 may be any conventional low frequency loudspeaker, such as a woofer.

The audio device 800 also includes a signal processor component 806, which collectively comprises a low pass filter 808, a high pass filter 810, a signal processor 812, a carrier generator 814, and first and second power amplifiers 816a, 816b. The signal processor component 806 is arranged to receive an input signal 818 (which is the electrical equivalent of an audible audio signal to be played by the parametric and low frequency transducers 802, 804) for processing into the first and second signals. First, the input signal 818 is separated into two signals of different frequency bands: a low frequency band signal (e.g. lower than 800 Hz) and a high frequency band signal (e.g. greater than 800 Hz) by the low pass and high pass filters 808, 810 respectively. The low frequency band signal is then amplified by the first power amplifier 816a into the second signal and provided to the low frequency transducer 804 for generating the second audio signal. On the other hand, the high frequency band signal is provided to the signal processor 812, which is modulated with a carrier signal from the carrier generator 814 to produce a modulated high frequency band signal. This modulated high frequency band signal is consequently amplified by the second power amplifier 816b into the first signal and provided to the parametric transducer 802 for generating the first audio signal. It is also to be appreciated that in certain variant embodiments, the signal processor component 806 may not be included as part of the audio device 800.

Figure 9:
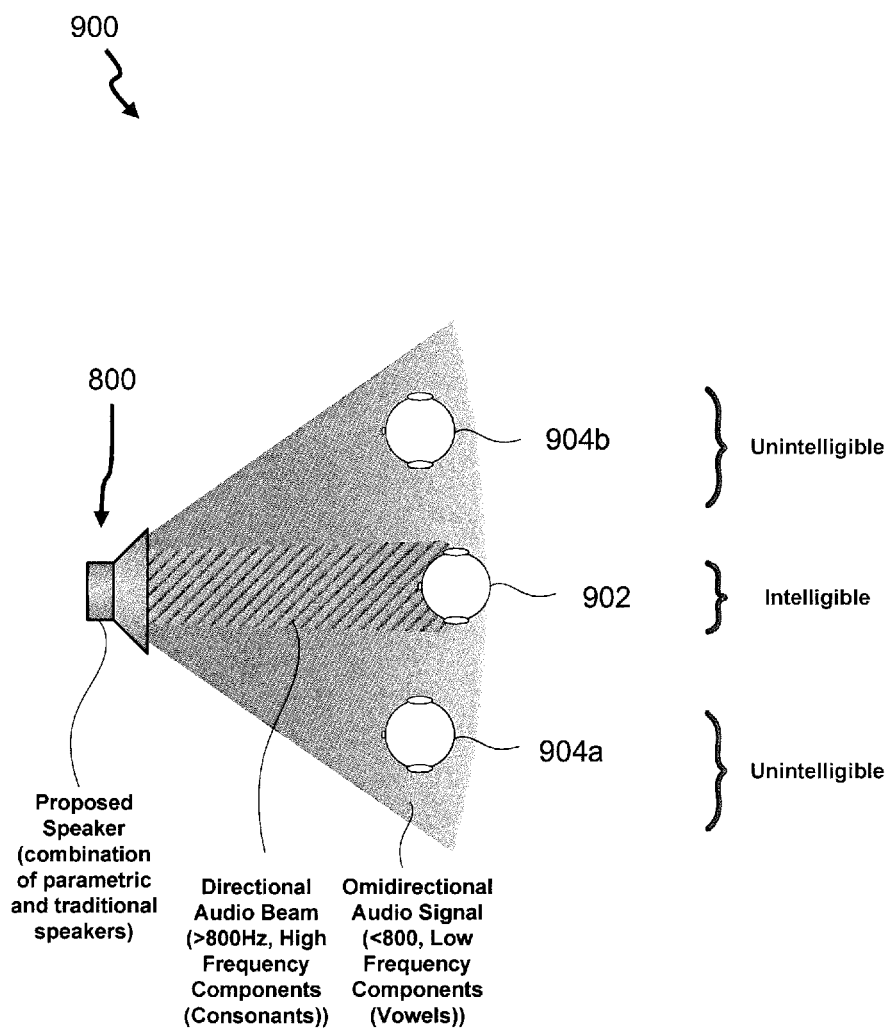
FIG. 9 illustrates how an audible audio signal generated by the audio device of FIG. 8 is heard only by a user of the audio device, and not by bystanders in the vicinity of the user.

FIG. 9 is an example illustration 900 of how the audible audio signal generated by the audio device 800 can only be heard by a user 902 of the audio device 800 (included in a smart device), and not by bystanders 904a, 904b in the vicinity of the user 902. The user 902 is positioned to directly face the audio device 800, so that the first audio signal is directionally beamed and transmitted to him. It may be seen that the user 902 hears the complete audio spectrum signals (including both the low frequency components (i.e. the low frequency components of vowels) and the high frequency components (i.e. the high frequency components of the vowels and full spectrum of the consonants)), whilst the bystanders 904a, 904b only hear the low frequency components of vowels. As a result, the intelligibility of the audible audio signal received by the bystanders 904a, 904b is significantly impaired, and hence the audio privacy of the user 902 is largely preserved and achieved. In other words, the user 902 has a private audio zone, as a result of using the audio device 800.

Hence, the audio device 800 (of FIG. 8) is configured to use the low frequency transducer 804 to generate most of the low frequency components of vowels (encompassing the first formant of speech), and use the parametric transducer 802 to generate higher frequency components of the vowels and the full spectrum of consonants (and fricatives). In this manner, bystanders besides a listener (to whom the audible audio signal is intended for) may only hear audio sounds below the said predetermined frequency (i.e. the low frequency components of vowels but not the consonants), while the intelligibility of the audible audio signal heard by the bystanders is significantly impaired/unintelligible. In this respect, it is well-established in the field of phonetics that if the low frequency (i.e. most vowels are of low frequencies), or high frequency (i.e. most consonants are of high frequencies) components of an audio signal are removed, the speech intelligibility is significantly impaired. Accordingly, a user of a smart device, which incorporates the proposed audio device 800 of FIG. 8, who is positioned in the private audio zone, would then hear the full speech spectrum sounds of the audible audio signal (i.e. intelligible audio). So, usage of the audio device 800 helps to beneficially improve audio privacy for users of personal smart devices, such as smart phones or tablet-computers (tablets). Use of earphones with the smart devices is then no longer necessary with deployment of the proposed audio device 800.

In all, the foregoing disclosed embodiments have advantages in improving the perception of added loudness (including increased low frequency and higher intelligibility) and significantly reducing power dissipation of the amplifier circuit 400 and audio devices 6000, 800 compared to conventional parametric loudspeakers, whilst also enabling a user to retain his own audio privacy when listening to audio output from his personal smart device.

Based on a fourth embodiment, there is disclosed a speaker apparatus (not shown) comprising a plurality of the audio device 800 of the third embodiment, wherein the apparatus has a substantially uniform thickness, and the thickness is substantially similar to a printed film, or other printed medium. So the speaker apparatus may also be termed a thin film speaker. Importantly, speaker apparatus may inconspicuously and cheaply be incorporated in wallpapers for rooms, due to its relatively thin thickness, to realise part of the functionalities for a smart home, but it will nonetheless be understood that other suitable envisaged applications for the speaker apparatus area are also broadly possible.

It is to be appreciated that the thickness of a printed film may generally range from anywhere between less than 1 μm to several mm (as will be understood by a skilled person), but in this case, a thickness of the thin film speaker is purposefully devised to be less than 1 mm. More specifically, the thickness of the thin film speaker may broadly be about 20 μm to 200 μm.

While the invention has been illustrated and described in detail in the drawings and foregoing description, such illustration and description are to be considered illustrative or exemplary, and not restrictive; the invention is not limited to the disclosed embodiments. For example, the proposed amplifier circuit 400 may be fabricated using CMOS processes, or any other suitable non-CMOS fabrication processes (e.g. III-V integration to further enhance power efficiency) as well. Also, the proposed amplifier circuit 400 may also be configured as other types of suitable amplifiers such as a linear amplifier, instead of being a Class D amplifier. Accordingly, other suitable output stages may then be used in place of the first and second Class D output stages 408a, 408b. Further, the first and second comparators 406a, 406b are considered optional (i.e. may be omitted), since they are not required, if the signal processor 404 is implemented using a Digital Signal Processor, or the like. For good order, it is to be appreciated that the preceding statement also applies, mutatis mutandis, to the audio device 600 of FIG. 6. Moreover, it is to be appreciated that the input signal ($V_{in}$) may be processed by the signal processor 404 into more than two signals (e.g. five signals), and as a result, a number of required output stages 408a, 408b (and also comparators 406a, 406b, if not deemed optional in that new configuration) needs to be increased accordingly (e.g. five output stages are required if the input signal ($V_{in}$) is divided into 5 secondary signals).

For the audio device 800 of FIG. 8, the parametric and low frequency transducers 802, 804 need not always be integrally formed to have a common central axis. Indeed, the parametric and low frequency transducers 802, 804 may be arranged (and positioned) on different respective axes, since the collective position of said transducers 802, 804 is not very critical due to the low frequency transducer 804 not being configured to emit a directional audio signal.

The invention claimed is:

1. An audio device comprising:
   (i) first and second parametric transducers for generating respective first and second output audio signals having an output carrier frequency;
   (ii) a signal processor for processing an input modulated signal into first and second signals with different phase-shifts, the input modulated signal being produced from modulation of a carrier signal by an input audio signal, the carrier signal having a same frequency as the output carrier frequency of the first and second parametric transducers; and
   (iii) first and second pairs of amplifier output stages arranged to respectively receive the first and second signals for generating first and second pairs of amplified signals to operate the first and second parametric transducers to generate corresponding first and second ultrasonic signals with the phase-shifts, the first and second ultrasonic signals serving respectively as the first and second output audio signals,
   wherein the signal processor, and the amplifier output stages collectively form an amplifier circuit;
   wherein the input modulated signal and the first and second signals are arranged with a substantially similar frequency to cause a switching frequency of the amplifier circuit to be matched to the output carrier frequency of the first and second parametric transducers; and
   wherein the first and second parametric transducers are arranged to direct the respective first and second ultrasonic signals towards a common area in the air to cause interaction of the first and second ultrasonic signals within the common area to obtain an audible audio signal.

2. The device according to claim 1, wherein the signal processor includes a signal separator.

3. The device according to claim 1, further comprising:
   a first resistive circuit element coupled to an output of the first pair of amplifier output stages;
   a first inductive circuit element coupled to another output of the first pair of amplifier output stages;
   a second resistive circuit element coupled to an output of the second pair of amplifier output stages; and
   a second inductive circuit element coupled to another output of the second pair of amplifier output stages.

4. The device according to claim 1, wherein the signal processor is further configured to receive the input modulated signal.

5. The device according to claim 1, wherein the output carrier frequency is 40 kHz.

6. The device according to claim 1, wherein each parametric transducer includes a bimorph transducer or at least one ultrasonic transducer.

7. The device according to claim 6, wherein the at least one ultrasonic transducer includes a plurality of ultrasonic transducers.

8. The device according to claim 1, further including first and second comparators arranged to respectively receive the first and second signals for generating corresponding first and second switching signals,
   wherein the first and second switching signals are respectively provided to the first and second pairs of amplifier output stages, and the first and second pairs of amplified signals are amplified switching signals.

9. The device according to claim 1, wherein the amplifier circuit is a Class D amplifier, and each amplifier output stage of the first and second pairs of amplifier output stages is a Class D output stage.

* * * * *